Jan. 31, 1961 P. PARZEN 2,970,214
WIDE BAND MICROWAVE RECEIVER
Filed Feb. 21, 1958
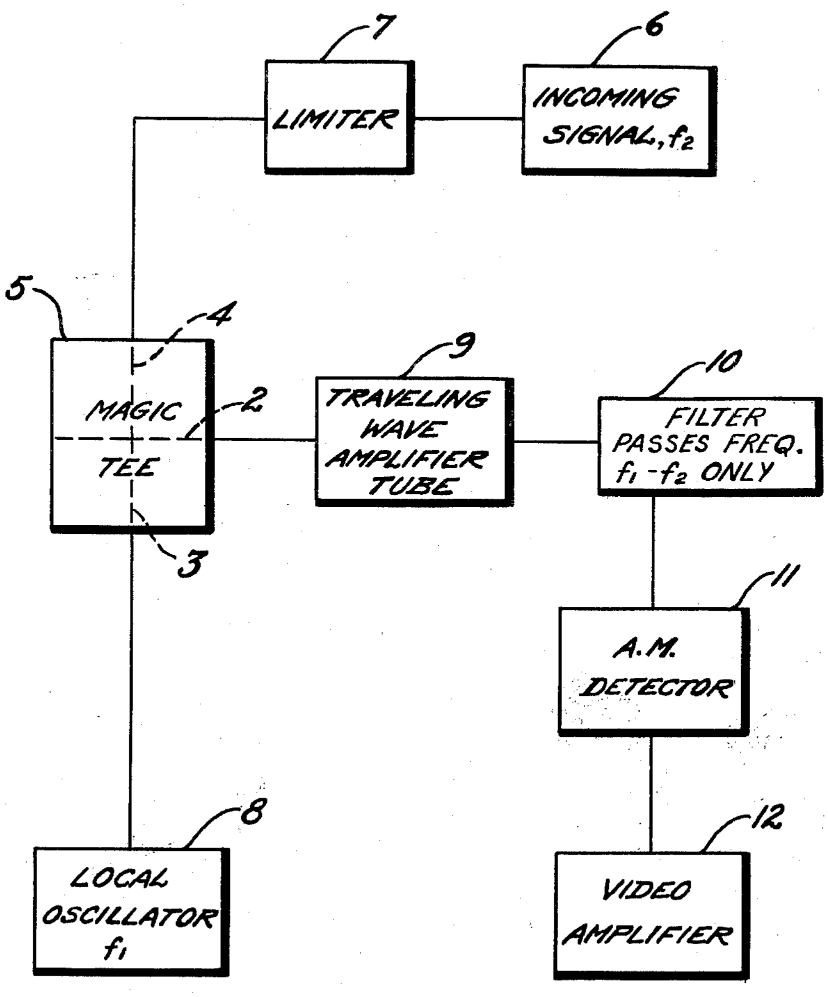
INVENTOR.
PHILIP PARZEN
BY Wade Koontz and George Lewis
ATTORNEYS United States Patent Office 2,970,214

Patented Jan. 31, 1961

2,970,214

WIDE BAND MICROWAVE RECEIVER

Philip Parzen, Forest Hills, N.Y., assignor to the United States of America as represented by the Secretary of the Air Force Filed Feb. 21, 1958, Ser. No. 716,827

3 Claims. (Cl. 250—29)

This invention relates to wide band microwave radar search receivers, and more particularly to such receivers which utilize the frequency discriminator properties of traveling wave tube amplifiers to provide wide bandwidths and high gain in the microwave regions.

In radar search receivers particularly those operating in the microwave region, it is important to have available adequate gain to utilize very weak signals and simultaneously provide wide bandwidths to properly utilize incoming signal pulses over a wide dynamic range.

Another important aspect in a radar search receiver relates to resolution. Resolution may be reduced by receiver bandwidths because a narrow-band receiver tends to spread out pulses it amplifies.

In accordance with the present invention, the frequency discrimination property of traveling wave tube amplifiers is utilized to provide a wide band, high gain search receivers.

The frequency discrimination property of a traveling wave tube amplifier as described in Philip Parzen's patent application, Serial No. 716,828, filed at even date herewith, Philip Parzen being on of the joint inventors of the aforesaid patent application, is achieved by utilizing the effect of intermodulation between two input signals of frequencies $f_1$ and $f_2$, in the pass band of a traveling wave tube amplifier each of said signals having an electrical power content, one of aforesaid two input signals being a received modulating signal of frequency $f_2$ and the other, a local oscillator signal of frequency $f_1$. The aforesaid traveling wave tube amplifier in addition to intermodulating aforesaid two input signals, said signals having an electrical power content, amplifies them so as to provide a power gain and therefore the energy output of the signal from said traveling wave tube amplifier has a power content the magnitude of which is a resultant of three concurrently applicable factors, now to be identified.

The first factor is the signal power output from said traveling wave tube amplifier in the absence of the modulating signal (frequency $f_2$). The second factor is that portion of the signal power output from said traveling wave tube amplifier that is proportional to the product of the local oscillator signal (frequency $f_1$) and modulating signal (frequency $f_2$) power inputs to said traveling wave tube amplifier but independent of the frequency difference signal $f_1—f_2$.

The third factor is that portion of the signal power output from said traveling wave tube amplifier that is proportional to the product of the local oscillator signal and modulating signal power inputs to said traveling wave tube amplifier and also the frequency difference signal $f_1—f_2$ resulting from the aforementioned intermodulation in said traveling wave tube amplifier, thus this device possesses the property of frequency discrimination.

Thus the intermodulation inherent in a traveling wave tube amplifier operates to produce frequency discrimination; in addition thereto the identical intermodulation within the traveling wave tube operates simultaneously to amplitude modulate the aforesaid frequency discriminated signals.

In accordance with the present invention the signal which is a pulsed carrier of frequencies $f_2$ and the local oscillator signal $f_1$ provided by the local oscillator are both fed into a traveling wave tube amplifier. From the output of the amplifier may be derived the function of $f_1—f_2$ only. Thus the system may be designed to yield only $f_1—f_2$.

Since the bandwidth of the receiver, in a large measure, is determined by the traveling wave tube amplifier, it is possible to obtain a large bandwidth as this is one of the characteristics inherent in the traveling wave tube amplifier.

It is also possible to obtain large amounts of power because of the gain available in traveling wave tube amplifiers. This power output may be varied by controlling the local oscillator.

It is an object of the present invention to provide a microwave radar receiver of very wide bandwidth and high gain.

It is another object of the present invention to provide a novel microwave radar receiver which utilizes the frequency discriminator property of a traveling wave tube.

The features of this invention which are believed to be new are set forth with particularly in the appended claims.

The invention itself, however, together with further objects and advantages thereof may best be understood by reference to the following description when taken in conjunction with the accompanying drawing.

In wide band search receiver, source 6 for the incoming signal may be a radar receiving antenna. The signal is a pulsed carrier of frequency $f_2$. This pulsed signal is fed into amplitude limiter 7 and then the limited pulsed signal is fed into the E-plane arm 4 of magic T 5, local oscillator 8 furnishes a signal of frequency $f_1$ which is fed into H-plane arm 3 of magic T 5. The magic T that is utilized may be such as shown and described in Radiation Laboratory Series, (1948), Vol. 16, pages 259-265, published by McGraw-Hill.

The resultant wave tube signal representation of the limited pulsed signal and local oscillator signal obtained from the magic T 5 is fed into the input traveling wave tube amplifier 9 which is terminated to fixed frequency filter 10.

The filter output (tuned to $f_1$) will be a function of $f_1—f_2$ as the output power is $$P=\alpha P_1+\beta P_1P_2+\gamma\frac{(f_1-f_2)}{f_1}P_1P_2+\frac{\gamma\delta}{f_1}P_1P_2\cos Wmt$$

where $P_1$ and $P_2$ are the local oscillator and pulsed signal power input respectively; $\alpha$, $\beta$, $\gamma$ are constants which depend upon $P_1$ and the D.C. operating conditions such as beam voltage current gain for traveling wave tube amplifier 9. Thus this system may be designed to yield $f_1—f_2$ rejecting all other frequencies by means of passing them through filter 10.

As a result of the intermodulation of the pulsed signal and local oscillator signal in traveling wave tube amplifier 9, the output signal of amplifier 9 is amplitude modulated. The signal from amplifier 9 is passed through filter 10 thereby excluding all but the aforesaid amplitude modulated signals. The filter output signal is detected in AM detector 11 which is a conventional AM detector. The detected signal is then fed into video amplifier 12.

The bandwidth of this receiver is determined by the Q of the filter and the bandwidth range ($\Delta$) of the traveling wave tube amplifier. Thus $$\frac{f_1}{Q}\leq f_2-f_1$$

and $$f_1 - f_2 \leq \Delta$$

It is possible to design the traveling wave tube amplifier so that the frequency intermodulation effect is comparable to that of amplitude. Thus the resolution of this receiver system is high.

While a particular embodiment of the invention has been shown and described, modifications may be made and it is intended in the appended claims to cover all such modifications as may fall within the true spirit and scope of the invention.

What is claimed is:

1. A wide band frequency modulation receiver comprising a limiter adapted to receive an incoming pulsed frequency modulated signal, a local oscillator generating a fixed frequency signal, a magic T adapted to receive the two said signals, a traveling wave tube amplifier receiving the resultant signal from said magic T, and said amplifier operating to amplitude modulate said resultant signal, filter means adapted to receive the output signal from said traveling wave tube amplifier, said filter means passing only said amplitude modulated signal, means to detect said amplitude modulated signals received from the output of said filter means, and video amplifying means for said detected signal.

2. A wide band frequency modulation radar receiver comprising means for receiving an incoming pulsed carrier frequency modulated radar signal, means to limit said pulsed radar signal, means to generate a local oscillator signal having a fixed frequency, a magic T having E and H-plane arms, said limited signal being fed into said E-plane arm and said fixed frequency signal being fed into said H-plane arm, a traveling wave tube amplifier impressed with the resultant wave trains signals from said magic T, amplitude modulated detecting means to indicate the output signal from said traveling wave tube amplifier, means interposed between said traveling wave tube amplifier and said amplitude modulated detecting means to restrict the energy flow therebetween to that portion of the signal which is equal to the frequency difference between said local oscillator signal and said pulsed carrier signal, said frequency difference signal being amplitude modulated and means to video amplify said detected signals.

3. A wide band radar frequency modulation receiver comprising means to receive a pulsed carrier frequency modulated radar signal, means to amplitude limit said radar signal, means to generate a local oscillator signal having a fixed frequency, means to combine said limited signal and said local oscillator signal to produce resultant wave train signals representative of said limited radar signal and said local oscillator signal, means to intermodulate said resultant wave train signals to produce a frequency discriminated amplitude modulated signal having a frequency equal to the difference between said local oscillator signal and said pulsed carrier radar signal, said amplitude modulated signal being representative of said received radar signal, means to detect said amplitude modulated signal, and means to video amplify said detected signal.

References Cited in the file of this patent

UNITED STATES PATENTS 2,657,305 Knol et al. ............. Oct. 27, 1953